(12) United States Patent
Vogt et al.

(10) Patent No.: US 10,161,808 B2
(45) Date of Patent: Dec. 25, 2018

(54) METHOD AND ARRANGEMENT FOR DETERMINING THE HEATING CONDITION OF A MIRROR IN AN OPTICAL SYSTEM

(71) Applicant: Carl Zeiss SMT GmbH, Oberkochen (DE)

(72) Inventors: Peter Vogt, Heidenheim (DE); Martin Hermann, Heidenheim (DE); Oliver Dier, Lauchheim (DE); Andras G. Major, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1067 days.

(21) Appl. No.: 13/863,595

(22) Filed: Apr. 16, 2013

(65) Prior Publication Data

US 2013/0230073 A1     Sep. 5, 2013

Related U.S. Application Data

(63) Continuation of application No. PCT/EP2011/070320, filed on Nov. 17, 2011.

(Continued)

(30) Foreign Application Priority Data

Nov. 25, 2010    (DE) .................. 10 2010 061 950

(51) Int. Cl.
*G01K 11/00*     (2006.01)
*G01J 5/00*      (2006.01)
(Continued)

(52) U.S. Cl.
CPC .......... *G01K 11/00* (2013.01); *G01B 9/02024* (2013.01); *G01B 9/02081* (2013.01);
(Continued)

(58) Field of Classification Search
CPC ... G01K 11/00; G03F 7/70316; G03F 7/7015; G03F 7/70591; G03F 7/70833;
(Continued)

(56) References Cited

U.S. PATENT DOCUMENTS 4,171,915 A    10/1979    Hesselink
4,231,657 A *  11/1980    Iwamatsu ............. G03F 7/2002
                                                 355/71

(Continued)

FOREIGN PATENT DOCUMENTS

CN    1601244 A    3/2005
CN    101305259 A  11/2008

(Continued)

OTHER PUBLICATIONS

Chinese Office Action and Search Report, with translation thereof, for CN Appln No. 201180056581.5, dated Dec. 10, 2014.

(Continued)

*Primary Examiner* — Gail Kaplan Verbitsky
(74) *Attorney, Agent, or Firm* — Fish & Richardson P.C.

(57) ABSTRACT

The invention concerns a method of and an arrangement for determining the heating condition of a mirror in an optical system, in particular in a microlithographic projection exposure apparatus. In an embodiment the mirror is an EUV mirror and a method according to the invention comprises the following steps: deflecting at least one input measuring beam on to the mirror; ascertaining at least one optical parameter of at least one output measuring beam produced from the input measuring beam after interaction with the mirror; and determining the heating condition of the mirror on the basis of the parameter.

27 Claims, 10 Drawing Sheets

Related U.S. Application Data (60) Provisional application No. 61/417,552, filed on Nov. 29, 2010.

(51) Int. Cl.
*G01M 11/00* (2006.01)
*G02B 7/18* (2006.01)
*G03F 7/20* (2006.01)
*G01B 9/02* (2006.01)

(52) U.S. Cl.
CPC .......... *G01M 11/005* (2013.01); *G02B 7/181* (2013.01); *G03F 7/708* (2013.01); *G03F 7/7085* (2013.01); *G03F 7/70891* (2013.01); *G01B 2290/70* (2013.01)

(58) Field of Classification Search
CPC ... G02B 5/0891; G02B 7/1815; G01J 1/4257; G01J 1/429
USPC ... 374/45–57, 210, 161, 120, 121, 130, 131, 374/43, 5; 356/43, 44; 359/846, 838, 359/869, 871
See application file for complete search history.

(56) References Cited

U.S. PATENT DOCUMENTS

| | | | |
|---|---|---|---|
| 4,644,899 A * | 2/1987 | Glaus | B05D 3/06 118/642 |
| 4,740,081 A | 4/1988 | Martens et al. | |
| 4,861,980 A * | 8/1989 | Dakin | G01D 5/26 250/227.23 |
| 4,993,824 A | 2/1991 | Bluege | |
| 5,206,924 A * | 4/1993 | Kersey | G01D 5/344 250/227.27 |
| 5,247,153 A * | 9/1993 | Pasch | G03F 7/70241 219/121.68 |
| 5,249,865 A | 10/1993 | Paranjpe et al. | |
| 5,683,180 A | 11/1997 | De Lyon et al. | |
| 6,142,641 A * | 11/2000 | Cohen | G01B 11/2441 359/731 |
| 6,174,081 B1 | 1/2001 | Holm | |
| 6,410,347 B1 | 6/2002 | Baek et al. | |
| 6,549,270 B1 * | 4/2003 | Ota | G03F 7/70233 355/53 |
| 6,829,096 B1 * | 12/2004 | Wade | G02B 5/1814 359/566 |
| 6,847,452 B2 * | 1/2005 | Hill | G03F 7/70775 356/450 |
| 6,953,281 B2 | 10/2005 | Hauenstein | |
| 7,364,354 B2 * | 4/2008 | Lakestani | G01K 17/20 374/43 |
| 8,388,219 B2 * | 3/2013 | Zettler | G01J 5/0003 374/2 |
| 8,425,060 B2 * | 4/2013 | Watson | G02B 7/008 359/846 |
| 8,622,612 B2 * | 1/2014 | Martinez | G01B 21/085 374/120 |
| 8,675,169 B2 * | 3/2014 | Van Boxtel | G03F 7/70091 355/30 |
| 9,041,908 B2 * | 5/2015 | Ruoff | G03F 7/70283 355/52 |
| 9,207,541 B2 * | 12/2015 | Hauf | G02B 7/181 |
| 9,523,922 B2 * | 12/2016 | Bach | G03F 7/70116 |
| 2004/0218186 A1 * | 11/2004 | Viol | B23K 26/705 356/450 |
| 2005/0099611 A1 * | 5/2005 | Sogard | G02B 7/1815 355/30 |
| 2005/0179879 A1 * | 8/2005 | Pril | G03F 7/70775 355/50 |
| 2008/0273180 A1 * | 11/2008 | Roux | G03F 7/70308 355/30 |
| 2009/0059345 A1 * | 3/2009 | Tung | B81B 3/001 359/290 |
| 2009/0080086 A1 * | 3/2009 | Shafer | G02B 13/143 359/651 |
| 2009/0116039 A1 | 5/2009 | Hidaka | |
| 2009/0257032 A1 | 10/2009 | Eva et al. | |
| 2010/0027576 A1 * | 2/2010 | Takeuchi | H01S 5/18391 372/45.01 |
| 2010/0135356 A1 * | 6/2010 | Schulz | G02B 7/008 374/161 |
| 2010/0140512 A1 * | 6/2010 | Suganuma | G03F 7/70033 250/504 R |
| 2010/0141957 A1 * | 6/2010 | Hou | G01B 11/26 356/487 |
| 2010/0165801 A1 * | 7/2010 | Boone, Jr. | G11B 5/314 369/13.11 |
| 2010/0320362 A1 * | 12/2010 | Alpert | H01S 3/083 250/200 |
| 2011/0255068 A1 * | 10/2011 | Kools | G02B 5/0891 355/71 |
| 2012/0092631 A1 * | 4/2012 | Van Boxtel | G03F 7/70091 355/30 |
| 2014/0071523 A1 * | 3/2014 | Hartjes | G02B 7/1815 359/359 |
| 2016/0011344 A1 * | 1/2016 | Beasley | G02B 5/085 359/360 |
| 2016/0048088 A1 * | 2/2016 | Hauf | G02B 7/1815 250/504 R |
| 2016/0161852 A1 * | 6/2016 | Schuster | G02B 5/0816 250/492.1 |
| 2016/0195818 A1 * | 7/2016 | Baer | G03F 7/70316 355/71 |
| 2016/0202399 A1 * | 7/2016 | Van Heugten | G02F 1/29 359/571 |
| 2016/0377988 A1 * | 12/2016 | Paul | G03F 7/70266 359/355 |

FOREIGN PATENT DOCUMENTS

| | | | |
|---|---|---|---|
| CN | 101517489 A | 8/2009 | |
| DE | 35 10 704 | 9/1986 | |
| DE | 3929290 | 3/1991 | |
| DE | 10 119599 | 10/2002 | |
| DE | 10 2008 026967 | 1/2010 | |
| EP | 0 359 157 | 12/1993 | |
| EP | 0754932 | 1/1997 | |
| EP | 1 517 124 A1 | 3/2005 | |
| EP | 2189768 A1 * | 5/2010 | ........... G01J 1/4257 |
| JP | 2000-286189 | 10/2000 | |
| JP | 2008009073 A * | 1/2008 | |
| JP | 446345 B2 * | 4/2010 | |
| RU | 2148802 C1 * | 5/2000 | |
| WO | WO 2009/083990 | 7/2009 | |

OTHER PUBLICATIONS

International Search Report and Written Opinion dated Mar. 7, 2012 in International Application No. PCT/EP2011/070320.
International Preliminary Report on Patentability for the corresponding PCT Application No. PCT/EP2011070320, dated May 28, 2013.
Boccara et al., "Sensitive photothermal deflection technique for measuring absorption in optically thin media," Optics Letters, 5(9):377-379, 1980.
Fischer et al., "Optical System Design," McGraw-Hill, Chapter 15, 308-314, 2000.
Jackson et al., "Photothermal deflection spectroscopy and detection," Appl. Optics, 20(8):1333- 1344, 1981.
Killeen et al., "In Situ Spectral Reflectance Monitoring of III-V Epitaxy," J. Electronic Materials, 23(2):179-183, 1994.
Oshikiri et al., "Optical Thickness Monitoring in Dielectric Multilayer Deposition for Surface-Emitting Laser Reflectors," Electronics and Communications in Japan, Part 2, 12-18, 1992.
Raffle et al., "In situ metalorganic vapor phase epitaxy control of GaAs/AlAs Bragg reflectors by laser reflectometry at 514 nm," Appl. Phys. Lett. 63(25):3479-3481, 1993.

(56) References Cited

OTHER PUBLICATIONS

Rhayem et al., "New Methodology on Electro-Thermal Characterization and Modeling of Large power Drivers Using Lateral PNP BJTs," $11^{th}$ *Int. Conf. on Thermal, Mechanical and Multiphysics Simulation and Experiments in Micro-Electronics and Micro-Systems,* EuroSimE 2010.
English translation and German Office Action, for DE 10 2010 061 950.7, dated Jul. 5, 2011.
Chinese Office Action, with translation thereof, for CN Appl No. 201180056581.5, dated Oct. 10, 2015.
Korean Office Action, with translation thereof, for corresponding Appl No. KR 20137013316, dated Dec. 18, 2017.

* cited by examiner

METHOD AND ARRANGEMENT FOR DETERMINING THE HEATING CONDITION OF A MIRROR IN AN OPTICAL SYSTEM

CROSS REFERENCE TO RELATED APPLICATIONS

This application claims is a continuation of, and claims priority under 35 U.S.C. § 120 to, international patent application PCT/EP2011/070320, filed Nov. 17, 2011, which claims priority under 35 U.S.C. § 119 to German Patent Application DE 10 2010 061 950.7 filed on Nov. 25, 2010. International patent application PCT/EP2011/070320 also claims priority under 35 U.S.C. § 119(e)(1) to US patent application 61/417,552, filed on Nov. 29, 2010. The content of these applications is hereby incorporated by reference.

FIELD OF THE INVENTION

The invention concerns a method and arrangement for determining the heating condition of a mirror in an optical system, in particular in a microlithographic projection exposure apparatus.

BACKGROUND

Microlithography is used for the production of micro structured components such as for example integrated circuits or LCDs. The microlithography process is carried out in a so-called projection exposure apparatus having an illumination system and a projection objective. In that case the image of a mask (=reticle) illuminated via the illumination system is projected via the projection objective on to a substrate (for example a silicon wafer) which is coated with a light-sensitive layer (photoresist) and arranged in the image plane of the projection objective in order to transfer the mask structure on to the light-sensitive coating on the substrate.

Mirrors are used as optical components for the imaging process in projection objectives designed for the EUV range, that is to say at wavelengths of for example about 13 nm or about 7 nm, due to the lack of availability of suitable translucent refractive materials. A problem which arises in practice is that the EUV mirrors experience a rise in temperature and linked thereto thermal expansion or deformation, as a consequence of absorption of the radiation emitted by the EUV light source but also because of cleaning in a hydrogen atmosphere, and such expansion or deformation in turn can result in worsening of the imaging properties of the optical system. To be able to assess those effects and possibly compensate for them there is a need to determine the extent of the mirror heating as accurately as possible.

SUMMARY OF THE INVENTION

An object of the present invention is to provide a method of and an arrangement for determining the heating condition of a mirror in an optical system, in particular in a microlithographic projection exposure apparatus, which without substantially worsening operation of the optical system, permit reliable characterisation of the heating condition.

That object is attained by the method in accordance with the features of independent claim 1 and the arrangement in accordance with the features of further independent claim 19.

A method of determining the heating condition of a mirror in an optical system, in particular in a microlithographic projection exposure apparatus, wherein the mirror is an EUV mirror, comprises the following steps:
deflecting at least one input measuring beam on to the mirror;
ascertaining at least one optical parameter of at least one output measuring beam produced from the input measuring beam after interaction with the mirror; and
determining the heating condition of the mirror on the basis of the optical parameter.

The operation of determining the change in temperature, which is effected in contact-less fashion by analysis of an output measuring beam produced from the input measuring beam after interaction with the mirror can be effected directly in the EUV projection objective and also during operation thereof, wherein, depending on the respective actual structure involved, as is described in greater detail hereinafter, the measuring light can be supplied and also carried away by way of optical fibers. Consequently, no additional electronics are required within the typically evacuated housing of the projection objective, and no stray light is introduced into the optical system. The method can be carried out in particular with a measuring arrangement which is connected in the form of a separate module to the projection objective.

In an embodiment the operation of ascertaining the at least one optical parameter includes ascertaining at least one value dependent on the refractive index of the mirror material. In that case it is possible in accordance with the invention to make use of the fact that the low coefficients of expansion which typically exist in the mirror material of EUV mirrors involve a comparatively pronounced temperature dependency in respect of the refractive index, which in turn makes it possible to infer a change in temperature of the mirror from measurement of the change in refractive index, with comparatively great accuracy (as described in fuller detail hereinafter).

In an embodiment the operation of ascertaining the at least one optical parameter includes ascertaining an optical path length change.

In an embodiment the operation of ascertaining the at least one optical parameter includes ascertaining the reflectivity at a predetermined wavelength.

In a further embodiment the operation of ascertaining the at least one optical parameter includes ascertaining the beam deflection of the output measuring beam relative to the input measuring beam.

In a further embodiment the operation of ascertaining the at least one optical parameter includes ascertaining the wavelength of the output measuring beam.

In an embodiment a plurality of input measuring beams is deflected on to the mirror. Those input measuring beams can be deflected on to the mirror in particular at different azimuth angles with respect to an optical axis of the optical system in order to obtain information about the temperature distribution of the mirror and possibly also any symmetry in respect of the heating effect in conjunction with certain illumination settings.

In an embodiment the output measuring beam is produced from the input measuring beam by passing at least once through the mirror.

The inventions also relates to a method of determining the heating condition of a mirror in an optical system, in particular in a micro lithographic projection exposure apparatus, wherein the method comprises the following steps:
deflecting at least one input measuring beam on to the mirror;

ascertaining at least one optical parameter of at least one output measuring beam produced from the input measuring beam after interaction with the mirror; and determining the heating condition of the mirror on the basis of the optical parameter, wherein the input measuring beam passes at least once through the region between the reflecting surface of the mirror and the mirror rear side.

The mirror comprises a substrate and a reflecting surface. Accordingly, the input measuring beam passes at least once through the substrate (corresponding to the region between the reflecting surface of the mirror and the mirror rear side). In particular, the input measuring beam can pass at least once through the substrate without being reflected at the (EUV-)reflecting surface of the mirror.

In particular the output measuring beam can be produced from the input measuring beam by passing through the mirror (or the mirror substrate, respectively) a plurality of times, whereby it is possible to achieve an increase in the length of the measuring section and thus an increase in measuring accuracy.

In an embodiment the output measuring beam is produced from the input measuring beam by reflection at an optical element arranged at the mirror.

The optical element can have at least one DBR (DBR='Distributed Bragg Reflector'). In addition the optical element can be a surface-emitting laser (VCSEL).

The invention also relates to a method of determining the heating condition of a mirror in an optical system, in particular in a microlithographic projection exposure apparatus, wherein the method comprises the following steps:

deflecting at least one input measuring beam on to the mirror;

ascertaining at least one optical parameter of at least one output measuring beam produced from the input measuring beam after interaction with the mirror; and determining the heating condition of the mirror on the basis of the optical parameter, wherein the output measuring beam is produced from the input measuring beam by reflection at an optical element arranged at the mirror, wherein the optical element has at least one DBR.

In particular, the mirror comprises a substrate and a reflecting surface, wherein the at least one DBR can be provided on the substrate of the mirror.

The invention also relates to a method of determining the heating condition of a mirror in an optical system, in particular in a microlithographic projection exposure apparatus, wherein the method comprises the following steps:

deflecting at least one input measuring beam on to the mirror;

ascertaining at least one optical parameter of at least one output measuring beam produced from the input measuring beam after interaction with the mirror; and determining the heating condition of the mirror on the basis of the optical parameter, wherein the output measuring beam is produced from the input measuring beam by reflection at an optical element arranged at the mirror, wherein the optical element is a surface-emitting laser (VCSEL).

In particular, the mirror comprises a substrate and a reflecting surface, wherein the VCSEL can be provided on the substrate of the mirror.

The invention also comprises embodiments in which the input measuring beam (from the light source) passes through the mirror substrate in order to reach the DBR or the VCSEL and/or in order to arrive (from the DBR or the VCSEL) at a detector.

In a further aspect the invention concerns an arrangement for determining the heating condition of a mirror in an optical system, in particular in a microlithographic projection exposure apparatus, wherein the mirror is an EUV mirror, the arrangement comprising:

a measuring light source unit for producing at least one input measuring beam;

a detector unit for ascertaining an optical parameter of at least one output measuring beam produced from the input measuring beam after interaction with the mirror; and an evaluation unit for determining the heating condition of the mirror on the basis of the parameter.

In an embodiment the measuring light source unit has a plurality of measuring light sources. In addition the detector unit can have a plurality of detectors. In particular a plurality of measuring light sources and/or a plurality of detectors can be arranged around the mirror at different azimuth angles with respect to an optical axis of the optical system.

In an embodiment a plurality of measuring light sources and/or a plurality of detectors are arranged matrix-like.

In a further aspect, the invention also relates to an arrangement for determining the heating condition of a mirror in an optical system, in particular in a micro lithographic projection exposure apparatus, the arrangement comprising:

a measuring light source unit for producing at least one input measuring beam;

a detector unit for ascertaining an optical parameter of at least one output measuring beam produced from the input measuring beam after interaction with the mirror; and an evaluation unit for determining the heating condition of the mirror on the basis of the parameter;

wherein the input measuring beam passes at least once through the region between the reflecting surface of the mirror and the mirror rear side.

In a further aspect, the invention also relates to an arrangement for determining the heating condition of a mirror in an optical system, in particular in a micro lithographic projection exposure apparatus, the arrangement comprising:

a measuring light source unit for producing at least one input measuring beam;

a detector unit for ascertaining an optical parameter of at least one output measuring beam produced from the input measuring beam after interaction with the mirror; and an evaluation unit for determining the heating condition of the mirror on the basis of the parameter;

wherein the mirror comprises a substrate and a reflecting surface, and wherein at least one DBR is provided on the substrate.

In a further aspect, the invention also relates to an arrangement for determining the heating condition of a mirror in an optical system, in particular in a micro lithographic projection exposure apparatus, the arrangement comprising:

a measuring light source unit for producing at least one input measuring beam;

a detector unit for ascertaining an optical parameter of at least one output measuring beam produced from the input measuring beam after interaction with the mirror; and an evaluation unit for determining the heating condition of the mirror on the basis of the parameter;

wherein the mirror comprises a substrate and a reflecting surface, and wherein at least one surface-emitting laser (VCSEL) is provided on the substrate.

Further configurations of the invention are set forth in the description and the appendant claims.

The invention is described in greater detail hereinafter with embodiments by way of example illustrated in the accompanying drawings.

DETAILED DESCRIPTION OF PREFERRED EMBODIMENTS

Hereinafter embodiments of the invention are described with reference to FIGS. 1 through 3, in which contact-less measurement of the temperature-induced change in refractive index is effected interferometrically, as relative and integral measurement.

Figure 1:
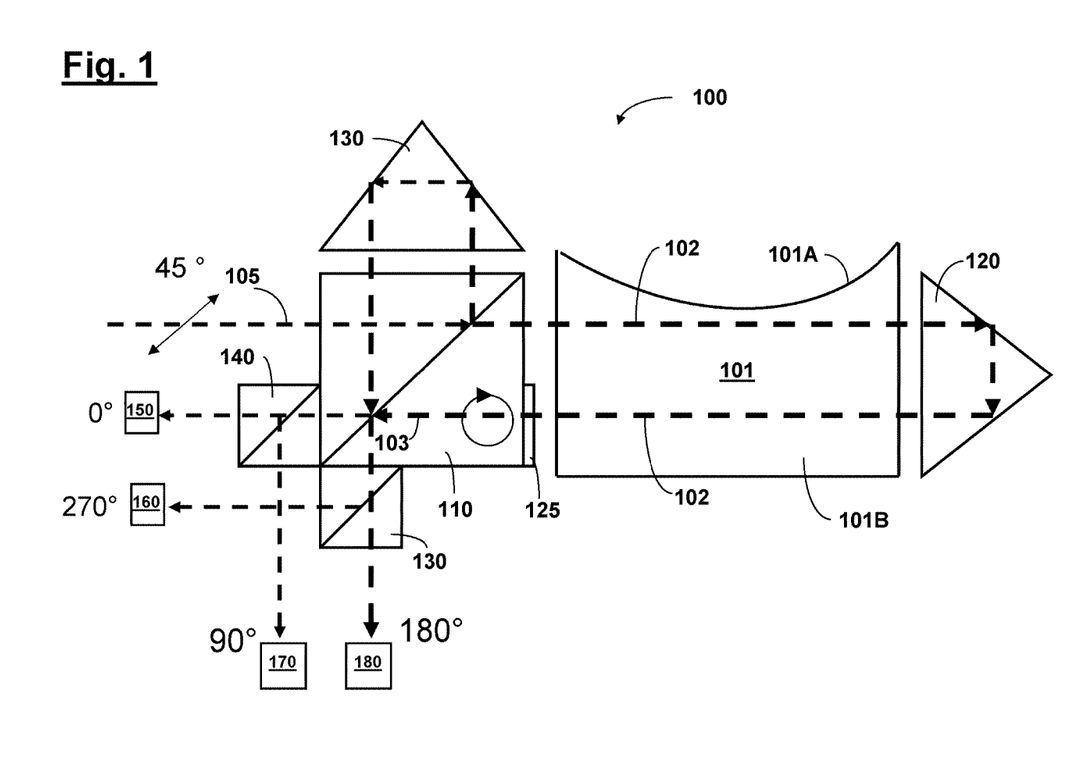
FIG. 1 shows a diagrammatic view to illustrate a measuring arrangement in accordance with an embodiment of the invention.

A measuring arrangement 100 by way of example for temperature measurement at a mirror 101 is shown in FIG. 1.

Referring to FIG. 1 a linearly polarised laser beam 105 produced by a laser light source (not shown) is coupled into the measuring arrangement 100 and is firstly incident on a polarisation-neutral or polarisation-independent beam splitter 110. Without the invention being restricted thereto for example an infrared laser involving a wavelength of a few micrometers (μm) can be used as the measuring light source. The laser beam 105 is coupled into the measuring arrangement 100 in such a way that the polarisation direction of the light incident on the beam splitter 110 is at an angle of 45° relative to the plane defined by the incident beam, the transmitted beam and the reflected beam so that as the outcome the reflected and the transmitted beams coincide in respect of their proportion of the overall intensity of the coupled-in light.

The light (input measuring beam 102) transmitted by the beam splitter 110 passes through the mirror 101 to be measured, is reflected at a deflection prism 120 and after again passing through the mirror 101 passes through a lambda/4 plate 125 which converts the light which is substantially linearly polarised (as a consequence of the negligible polarisation influence of the deflection prism 120) into circularly polarised light (output measuring beam 103). Here and in the following embodiments (and as can be gathered from the drawings) the mirror 101 comprises a substrate 101B and a reflecting surface 101A. The substrate 101B can e.g. be made from a material, i.e. can comprise a material or consist of a material, said material having a zero-cross temperature (zero-crossing temperature), i.e. also a temperature-dependent thermal expansion coefficient (=coefficient of thermal expansion), such as e.g. zerodur® or ULE®.

As can be gathered from FIG. 1, the input measuring beam 102 passes at least once through the mirror substrate 101B without being reflected at the reflecting surface (which is the concave, upper surface of the mirror in FIG. 1) 101A of the mirror 101. With other words, the input measuring beam 102 passes at least once (in the specific embodiment, twice) through the region between the reflecting surface 101A of the mirror 101 and the rear side (lower surface of the mirror in FIG. 1) of the mirror 101.

Polarisation beam splitters 130 and 140 serve for measurement of the component (measuring output beam 103) which is then transmitted and reflected respectively by the beam splitter 110. Downstream of the second polarisation beam splitter 140 there are angles in respect of the polarisation direction of 0° and 90° for the component transmitted by the beam splitter 110, the associated light components being measured by way of photodiodes 150 and 170 respectively. Downstream of the first polarisation beam splitter 130 there are angles in respect of the polarisation direction of 180° and 270° for the component reflected in the beam splitter 110, the associated light components being measured by way of photodiodes 180 and 160 respectively.

Accordingly comparatively disturbance-insensitive evaluation of four push-pull signals is effected via the measuring arrangement of FIG. 1. In addition the arrangement adopted in FIG. 1 provides for the measuring (laser) beam to be coupled in and out on the same side of the measuring arrangement 100 and thus provides that the light passes twice through the mirror material, leading to increased measuring accuracy.

In practice after the light source of the optical system has been brought into operation or switched on the start temperature or switch-on temperature (for example $T_0 = 22°$ C.) is determined via an absolute temperature sensor and used as a reference temperature by a counter at that start time being set to zero and then the interference stripes which occur upon heating of the measured mirror 101 in interferometric measurement being counted. In that way, the change in temperature of the mirror can be ascertained via equation (1), for example with degrees of accuracy in the millikelvin (mK) range, a degree of resolution by way of example which can be achieved according to the invention being 0.4 mK. The relationship between the optical path length difference OPD which is interferometrically determined via the measuring arrangement and the change in temperature causing that path length difference OPD is given by:

$$OPD(\delta) = dn/d\delta * \Delta\delta * L \qquad (1)$$

wherein δ denotes the temperature (in units of Kelvin, K), dn/dδ denotes the temperature-dependent change in refractive index (in units of 1/K) and L denotes the measuring distance. The value of dn/dδ is known for the respective mirror material used and for example in the case of glasses with a low degree of thermal expansion is $dn/d\delta > 10 * 10^{-6}$ $K^{-1}$.

Determining the change in temperature in accordance with the invention can be effected directly in the EUV projection objective and also during operation thereof, for which purpose for example the measuring light can be both supplied and also taken away by way of optical fibers whereby the measuring arrangement can be connected in the form of a separate module to the projection objective. That configuration has the advantage that no additional electronics are required within the typically evacuated housing of the projection objective and also no stray light is introduced into the optical system.

It will be appreciated that the measuring arrangement described with reference to FIG. 1 is only by way of example and it is also possible to use another suitable measuring arrangement. In principle the measuring arrangement according to the invention can operate both in accordance with the so-called homodyne method (that is to say with superimposition of signals of identical frequency, as described hereinbefore) and also in accordance with the so-called heterodyne method (that is to say with superimposition of signals of differing frequency). As an example of the last-mentioned principle, it is also possible to use two laser modes at different frequencies, insofar as Zeeman splitting is effected in a resonator by the application of an external magnetic field so that two different polarisation components (with right-handed and left-handed circular polarisation respectively) are produced, which in turn can be evaluated via a polarisation divider.

Figure 2:
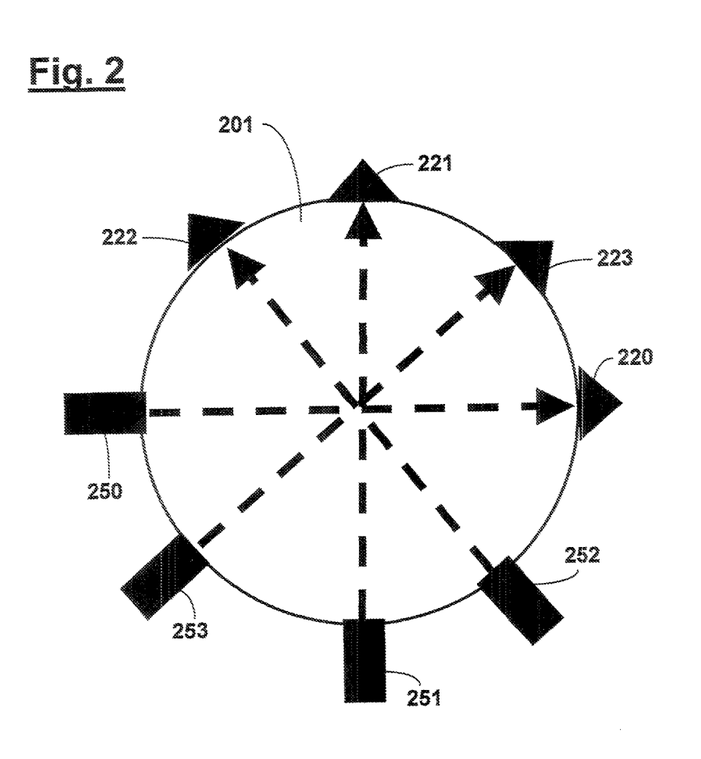
FIG. 2 shows a diagrammatic view to illustrate a further embodiment of a measuring arrangement according to the invention.

Referring to FIG. 2 measurement according to the invention can be effected in such a way that a plurality of input measuring beams are deflected on to the mirror 201, wherein the measuring light is coupled in and out respectively at mutually different azimuth angles. In the FIG. 2 embodiment four measuring arrangements as were described with reference to FIG. 1 are arranged around a mirror 201 shown in plan view, in respective mutually displaced relationship through 90° in the peripheral direction, wherein, based on the structure of FIG. 1 for each of those measuring arrangements, a respective pair of a photodiode 250-253 and a deflection prism 220-223 are indicated here.

The number and azimuthal orientation of the measuring arrangements can be selected variably in each case in accordance with the specific requirements. For example, in a further embodiment, eight measuring arrangements of the structure described with reference to FIG. 1 can also be provided in azimuthally displaced relationship in the peripheral direction around the mirror 201 to be measured. In that case, in the course of the above-described evaluation of the different azimuthal path length changes a corresponding change in temperature and also deformation involved with that change in temperature in the axial direction (with respect to the optical axis of the system) can be inferred. Accordingly it is possible in that way to ascertain what imaging errors are produced by the deformation of the mirror, that is involved with the change in temperature caused for example by a given illumination setting.

Figure 3A:
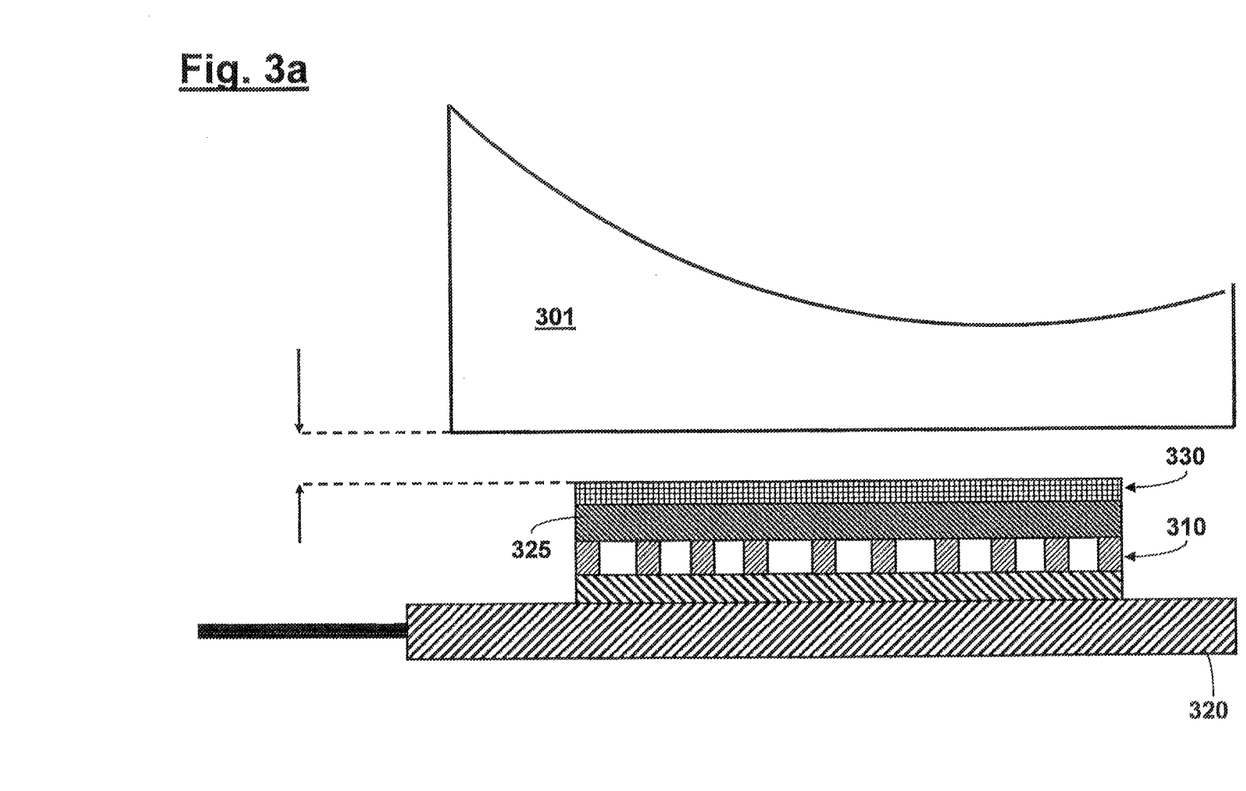
FIGS. 3a-g show diagrammatic views of possible embodiments of temperature adjustment or regulation effected in accordance with the invention in relation to a mirror.
Figure 3B:
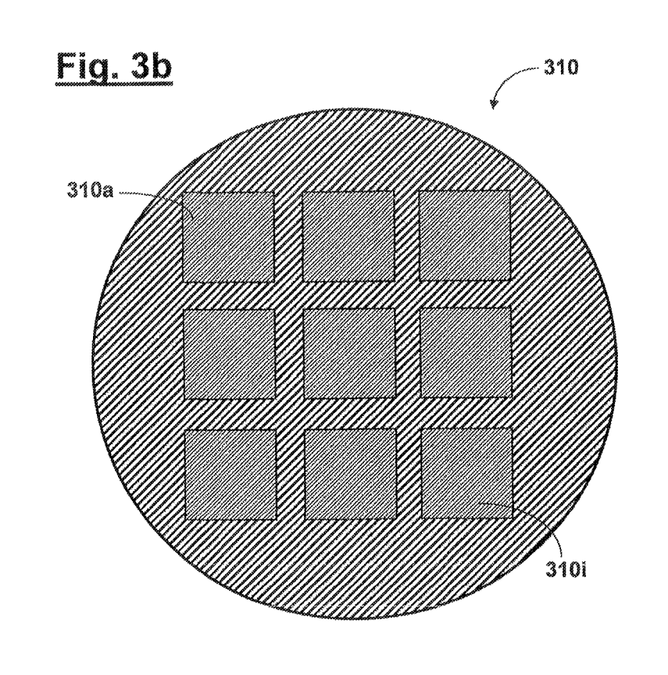
Figure 3C:
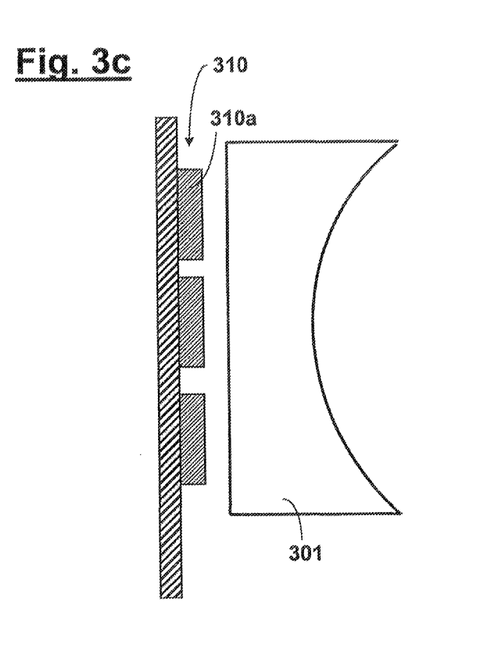

As soon as the heating condition of the mirror 101 or 201 has been determined suitable correction measures can be initiated. Reference is made to FIG. 3 hereinafter to show how that can be effected using an external heating or cooling device in order to compensate for or homogenise the imaging errors which occur. Conventionally that is effected for example by additionally introducing specifically deformed optical elements into the beam path. An alternative approach (in which it is possible to dispense with such additional deformed optical elements) is described hereinafter with reference to FIG. 3.

That approach is based on the fact that the effect which dominates for heat transport in the atmosphere typically used (for example krypton, argon etc) is that of heat conduction. For that purpose the structure shown in FIG. 3 includes a matrix-like arrangement 310 of Peltier elements 310a, . . . on a (for example water-)cooled base plate 320. The base plate 320 serves to take account of the limited temperature range of the Peltier elements 310a, . . . , within which the Peltier elements 310a, . . . can set or maintain a given temperature. Typically that difference temperature range is about 60-80° C. A suitable offset can be predetermined by the cooled base plate 320 for that temperature range so as to permit a reduction in the temperature to for example 10° C. or 20° C.

Associated with the Peltier elements 310a, . . . is a measuring sensor 330 which in the illustrated embodiment is disposed on a ceramic substrate 325 and directly measures the temperature with which the respective Peltier element 310a, . . . radiates into the mirror 301. Suitable cooling or heating bores can be arranged on the rear side of the mirror, which prevent the Peltier elements 310a, . . . from touching each other and prevent an unwanted 'cross-talk' occurring between them.

Temperature regulation can be effected via the structure shown in FIG. 3 and for example the change in temperature of the mirror 301, resulting from a given illumination setting, can be compensated (so that for example there is no need to introduce specifically deformed transmissive elements into the beam path).

Although the structure in FIG. 3 can advantageously be combined with the characterisation of the change in temperature of the mirror, described hereinbefore with reference to FIGS. 1 and 2, in order in that way for example to implement regulation of the temperature on the basis of the ascertained change in temperature, the invention is not restricted thereto. Thus in further embodiments the structure of FIG. 3 can also be used independently of measurement of the change in temperature or as a stand-alone unit in order to effect specifically targeted influencing of the temperature of the mirror 301 for example in dependence on the respective illumination setting and as a result to achieve homogenisation of the variation in temperature in the mirror 301 or optimisation of the imaging characteristics of the mirror 301.

Figure 3D:
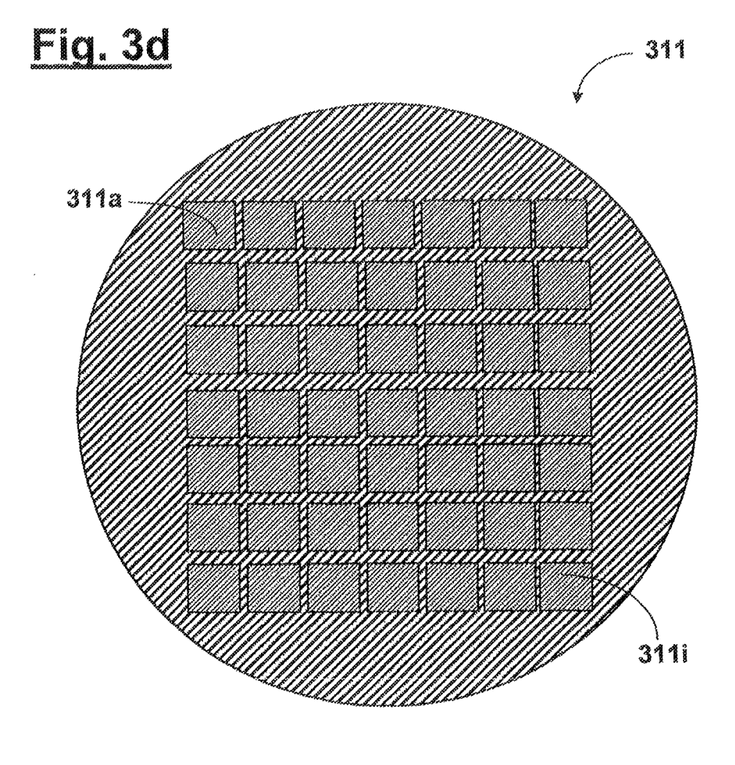
Figure 3E:
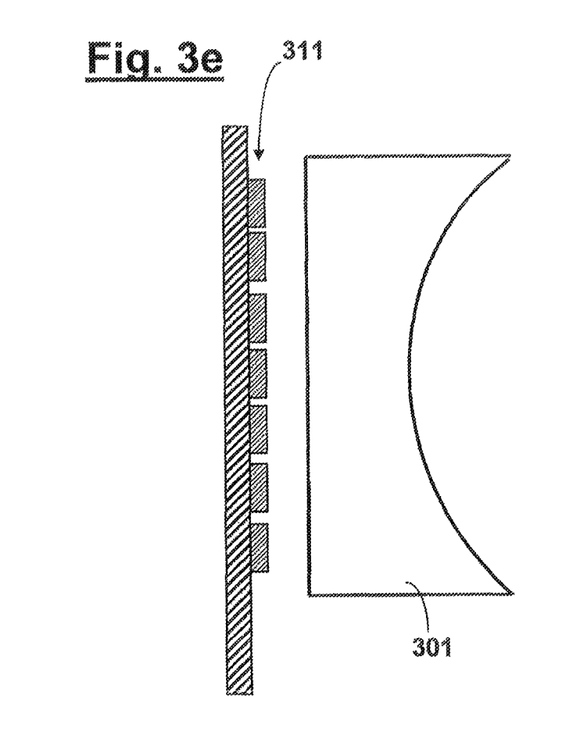
Figure 3F:
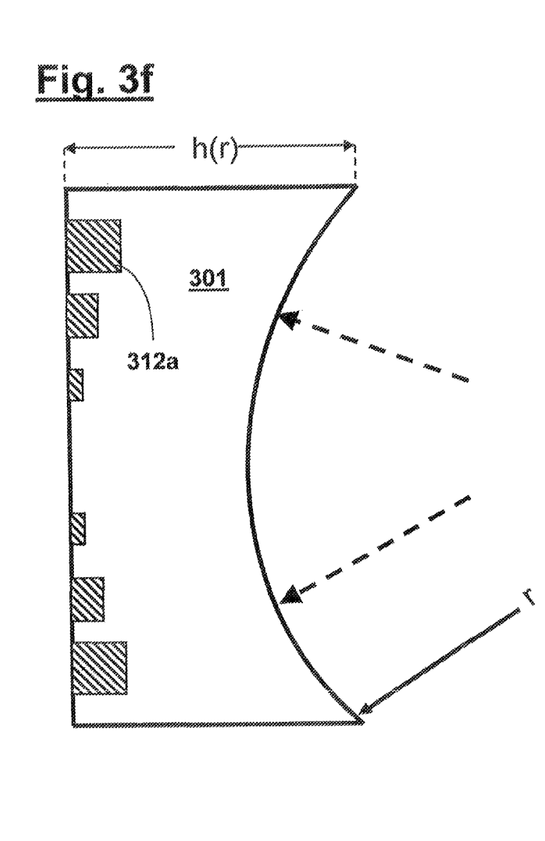
Figure 3G:
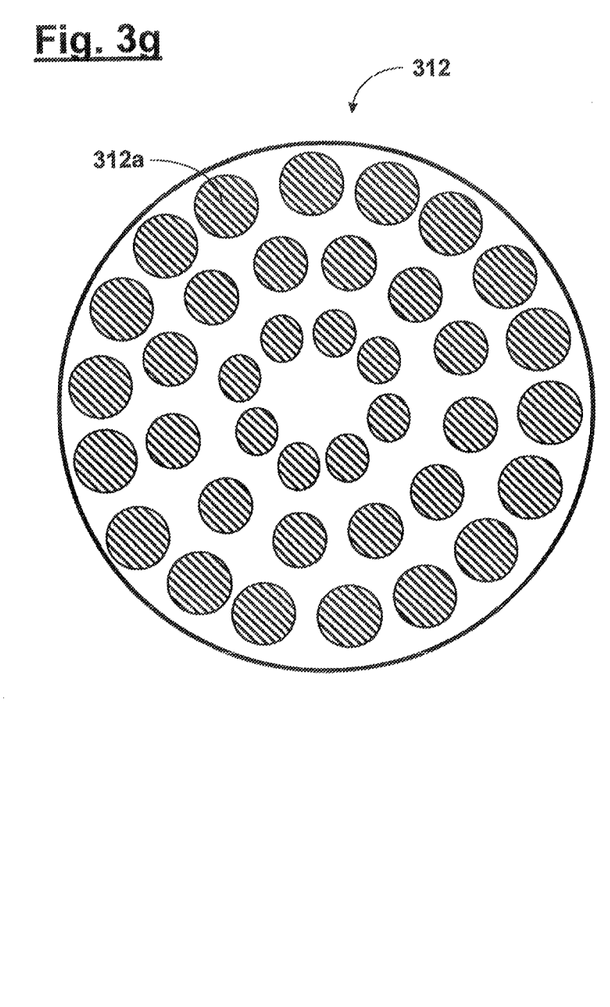

As shown in FIG. 3d (in cross-section) and FIG. 3e (in plan view), the arrangement and number of the cooling or heating bores or the Peltier elements 310a, . . . can be varied in accordance with the respective specific requirements involved to achieve a temperature distribution which is as homogenous as possible, while FIG. 3f (in section) and FIG. 3g (in plan view) shows for example a concentric arrangement of the cooling and heating bores or the Peltier elements on the rear side of the mirror.

Embodiments of the invention are described hereinafter with reference to FIGS. 4ff, in which a change in refractive index or a refractive index gradient which is continuously set over the mirror to be measured is utilised to determine the heating condition of the mirror.

Figure 4:
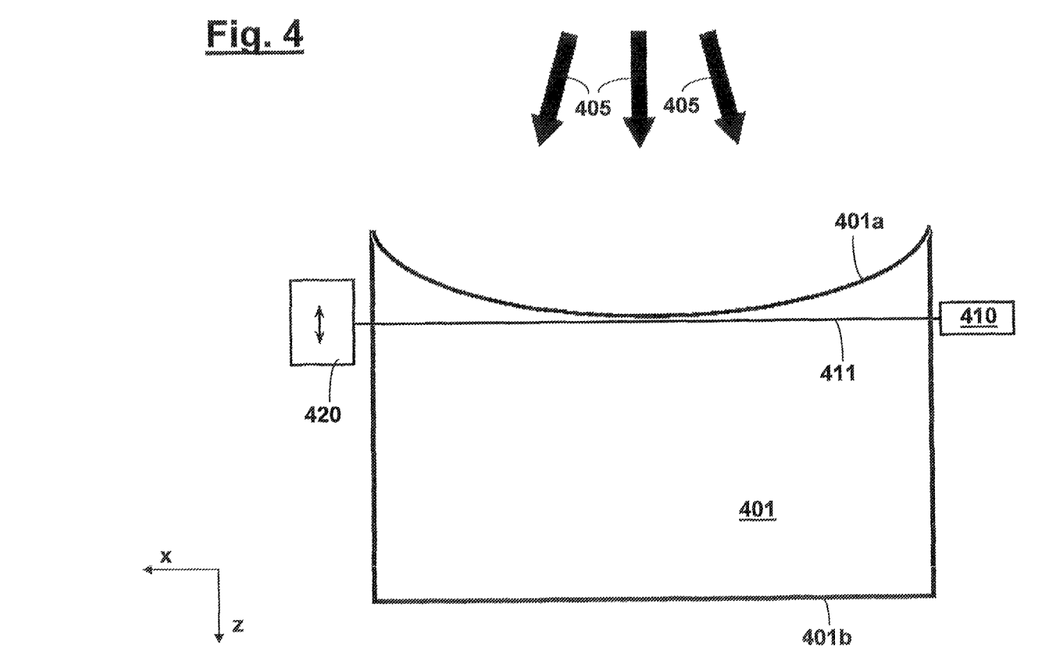
FIGS. 4-7 show diagrammatic views to illustrate further embodiments of a measuring arrangement according to the invention.

FIG. 4, to illustrate the measuring principle, firstly shows a mirror 401 to be measured in the form of a concave mirror on which light 405 is incident from an EUV light source (not shown) so that the mirror 401 heats up. The mirror 401 can be cooled on its rear side.

Accordingly, there is a refractive index gradient from the light entrance surface 401a (which is heated most strongly) to the mirror rear side 401b.

Now, as shown in FIG. 4, a light beam 411 from a laser diode 410 is deflected to a position detector 420 (for example in the form of a CCD camera or a CCD array) through the mirror 401 transversely to the direction of propagation of the EUV light 405, that is in the z-direction in the co-ordinate system, that is to say in the x-direction. Instead of the laser diode 410 it is also possible to use any other suitable light source, wherein it is preferably monochromatic in order to avoid influence of the wavelength dependency of the refractive index, and the choice of wavelength is such that the material of the mirror 401 is sufficiently translucent.

As can be gathered from FIG. 4, the input measuring beam passes at least once through the mirror substrate without being reflected at the reflecting surface (which is the concave, upper surface of the mirror in FIG. 4) of the mirror 401. With other words, the input measuring beam passes at least once through the region between the reflecting surface of the mirror 401 and the mirror rear side 401b.

The light beam 411 which passes through the mirror 401 perpendicularly to the refractive index gradient produced by virtue of the heating condition of the mirror 401 'sees' different refractive indices as a consequence of the refractive index gradient over the beam cross-section. In particular expressed in graphic terms, the left-hand edge of the light beam 411 (whose diameter can be in the range of 1-5 mm just by way of example and without the invention being restricted thereto) experiences a higher or lower refractive index than the right-hand edge of the light beam 411, which results in different speeds of propagation over the cross-section of the light beam 411 and thus deflection of the latter. Accordingly therefore the refractive index gradient which is continuously set over the mirror 401 to be measured is converted into a change in position of the light beam 411, that can be measured via the position detector 420.

It will be appreciated that the invention is not limited to the geometry shown in FIG. 4 in respect of the configuration of the light beam 411 through the mirror 410. All that is required for functioning of the measurement principle described with reference to FIG. 4 is that the refractive index gradient has a component perpendicular to the direction of propagation of the light beam 411 so that as a result that provides for bending of the wave front and thus beam deflection of the light beam 411.

In further embodiments a plurality of light beams can also be deflected by the mirror 401 insofar as a corresponding arrangement (linear, in matrix form or any other) of laser diodes (for example at a spacing of a few millimeters from each other) is arranged along the mirror and the change in position is ascertained by way of a suitable position detector arrangement (for example in the form of a quadrant photodiode or another, in particular matrix-form detector arrangement). In further embodiments therefore a plurality of light beams can also be deflected by the mirror 401 at different beam angles, whereby in particular account can also be taken of the configuration (being concave in the example) of the curved optically effective surface of the mirror 401 and the variation involved therewith in the change in temperature of the mirror in the x- and y-directions respectively.

A plurality of light sources or laser diodes 401 can also be arranged in azimuthally displaced relationship in the peripheral direction around the mirror 401 to provide information about the temperature distribution of the mirror 401 and any symmetry in heating in conjunction with given illumination settings. In that way it is possible to take account of or measure a non-homogenous heating effect of the mirror 401, that is involved with the use of given illumination settings. The passage of a plurality of light beams through the mirror 401 at different beam angles can be effected both via an arrangement of a plurality of light sources or laser diodes 410 at different angles or also by a suitable configuration of reflecting mirror side surfaces on the mirror 401.

In further embodiments the measuring section can also be increased in length by the respective mirror side surfaces being of a reflecting nature via a suitable coating (for example of aluminum) so that this provides an increase in the resulting beam deflection and thus also an increase in the accuracy of measurement. When using only one measuring section or laser diode, it may be advantageous if, as shown in FIG. 4, it is arranged in the immediate proximity (for example at a spacing of less than 2 mm) of the light entrance surface 410a or tangentially in relation thereto as the refractive index gradient to be utilised can be particularly pronounced in that region, depending on the respective configuration of the mirror 401 (in particular if it is made from a material of high thermal conductivity).

The operation of determining the change in refractive index, which is effected as shown in FIG. 4, can also be effected directly in the EUV projection objective and also directly during operation thereof, for which purpose for example the measuring light can be supplied and also carried away by way of optical fibers. That design configuration has the advantage that no additional electronics are required within the typically evacuated housing of the projection objective and also no additional stray light can be introduced into the optical system.

A calibration operation can be performed prior to the above-described measurement procedure, in the course of which calibration the relationship between the change in position of the light beam 411 and the change in temperature of the mirror 401 is ascertained for predetermined and specifically set values of the change in temperature.

Although the measurement principle described with reference to FIG. 4 was described using the example of a concave mirror 401 the invention is not limited thereto. Thus the mirror for example can also be convexly curved or planar. In particular the refractive index gradient required for the measurement procedure is afforded for example when active cooling is effected on the rear side of the mirror, within all of the mirror material, so that the light beam 410 can also pass through at a greater spacing from the optically effective surface 401a and the curvature of that optically effective surface 401a no longer plays any significant part. However, even in the situation where the refractive index gradient is produced substantially over a distance of a few millimeters within the mirror material and thus only in the immediate proximity of the optically effective surface 401a, the configuration of the light beam 411 through the mirror 401, as described hereinbefore, can be implemented at different beam angles and thus can be adapted to the curvature of the optically effective surface 401a.

In accordance with further embodiments, to suppress interfering measurement noise and to increase measuring accuracy via the measuring arrangement of FIG. 4, a lock-in procedure can be employed. In that way, it is possible to take account of the fact that, in operation of a projection exposure apparatus, illumination is typically effected in pulsed fashion, wherein a typical frequency in a projection exposure apparatus designed for EUV can be in the region of 10 kHz so that under some circumstances the temperature gradient can also be built up and reduced again with a corresponding frequency, in the mirror material.

Further embodiments of the invention are described hereinafter with reference to FIGS. 5 through 7, which are based on the change in the refractive index of semiconductor layers with temperature. Those semiconductor layers can be in the form of so-called DBRs (='Distributed Bragg Reflectors'). DBRs have an alternate arrangement of high-refractive and low-refractive materials (for example AlGaAs and GaAs semiconductors), which provides that upon irradiation with light for example of a 1 µm wavelength, a proportion of the light is reflected back at each second interface.

Figure 5:
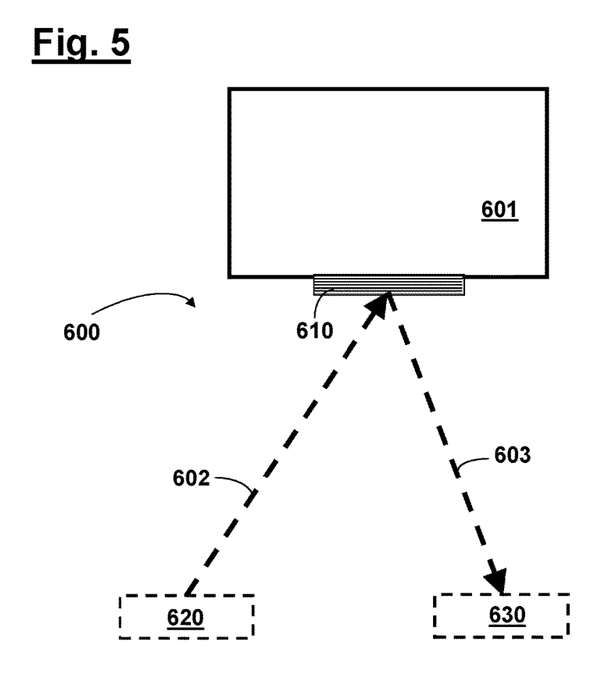

As shown in FIG. 5, such a DBR 610 is applied to a mirror 601 to be measured (comprising a substrate and a reflecting surface), this in practice being effected in the optically unused region of the mirror 601. In particular, the DBR 610 can be applied to the mirror substrate of the mirror 601. Contacting can be effected for example by way of a silver conductive adhesive or indium to achieve a resistance which is as low as possible at the transition between the mirror 601 and the DBR 610. The DBR 610 is kept at the temperature of the mirror 601 as a consequence of the contact therewith.

A light source 620 (for example a laser diode) whose wavelength is preferably in the infrared range (for example at $\lambda \approx 1$ μm) deflects the measurement light 602 on to the DBR 610 and a suitable detector 630 (for example a CCD camera) measures the light 603 reflected at the DBR 610. The invention also comprises embodiments in which the input measuring beam 602 from the light source 620 passes through the mirror substrate in order to reach the DBR 610 and/or in order to arrive (from the DBR 610) at the detector 630. The use of infrared light is particularly suitable for the reason that the influence of temperature on the reflectivity curve in the infrared range is substantially greater than for example with EUV light. The measurement arrangement 600 of FIG. 5, like the measuring arrangements of the above-described embodiments, has the advantage that measurement is effected in completely contact-less fashion.

As a consequence of mounting the DBR 610 as shown in FIG. 5 to the mirror 601 to be measured a change in temperature of the mirror 601 leads to a shift in the reflection spectrum as the refractive index, the band gap and (as a consequence of thermal expansion) also the layer thickness of the DBR 610 change as a consequence of the variation in temperature. The change in temperature of the mirror 601 can thus be inferred from the change in reflectivity of the DBR 610, which is involved with a change in temperature of the mirror 601.

In accordance with a further measurement principle described with reference to FIGS. 6 and 7, an optical element 710 can also be mounted to a mirror 701 (comprising a substrate and a reflecting surface) to be measured, wherein two DBRs are combined in the element 710 with a laser-active zone to give a surface-emitting laser (VCSEL). In particular, the optical element 710 can be applied to the mirror substrate of the mirror 701. Input light 702 has to be reflected to and from between the two DBRs to excite the laser-active zone to yield output light 703. Upon a change in temperature the reflection capability of the DBRs now changes, while in addition thermal expansion of the laser-active zone therebetween also occurs, so that a change in temperature is involved with a change in the base emission mode of the surface-emitting laser (VCSEL), which in turn is determined as shown in FIG. 6 with a spectrometer 730. In other words the change in temperature of the mirror 701 ultimately leads to a shift in the wavelength of the light emitted by the surface-emitting laser (VCSEL), wherein that shift which is dependent on the temperature of the mirror 701 can typically be in the range of 0.2-0.3 nm/K. In that case a surface-emitting laser (VCSEL) which is for example suitable according to the invention is based on AlGaAs and GaAs semiconductors which can have an emission wavelength in the range of between 800 nm and 1100 nm. The invention also comprises embodiments in which the input measuring beam from the light source 720 passes through the mirror substrate in order to reach the optical element 710 and/or in order to arrive (from the optical element 710) at the spectrometer 730.

In further embodiments, instead of the VCSEL, it is also possible to use a quantum cascade laser which can be excited by way of microwaves (by using a microwave source instead of the light source 710).

Figure 6:
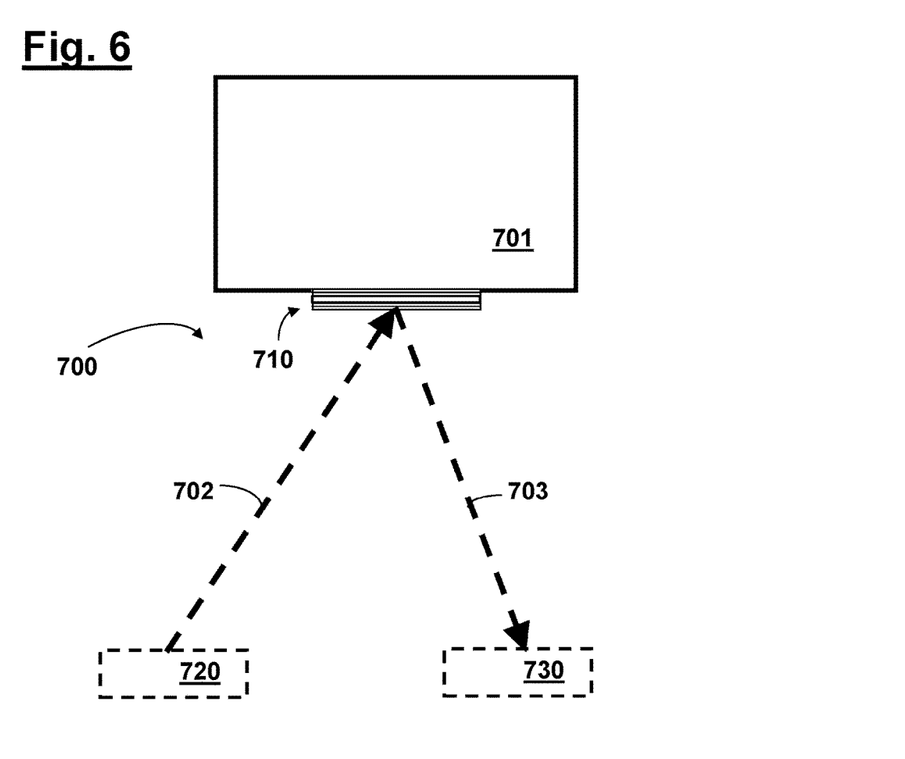

As the change in emission wavelength of the surface-emitting laser, that is utilised with the measurement principle described hereinbefore with reference to FIG. 6, also occurs with slight changes in temperature of the mirror (for example by only 0.01 K), the limiting factor for temperature resolution is ultimately the wavelength resolution of the spectrometer 730. In that respect, temperature resolutions in the range of 0.3-0.5 K can already be achieved with spectrometers which are available as standard. Higher levels of temperature resolution for example up to 0.05-0.1 K are possible for example when using a Fourier-transforming spectrometer which permits levels of wavelength resolution in the region below 0.1 nm (typically between 0.035 mm and 1.5 μm).

As regards the working wavelength of the measurement light source 620 or 720 respectively, used in the measuring arrangements of FIG. 5 and FIG. 6, that is preferably approximately at the center of the reflection curve with the approach described with reference to FIG. 6, so that an effect in respect of the laser-active zone that is as pronounced as possible is achieved (in which the change in temperature leads in particular to a change in the band gap and thermal expansion in the laser-active zone). In contrast, with the approach described hereinbefore with reference to FIG. 5, a working wavelength in the region of the edge of the reflection spectrum $R(\lambda)$ is preferably adopted so that the influence of the change in temperature on the reflectivity of the DBR 610 is as great as possible or at its maximum.

Figure 7:
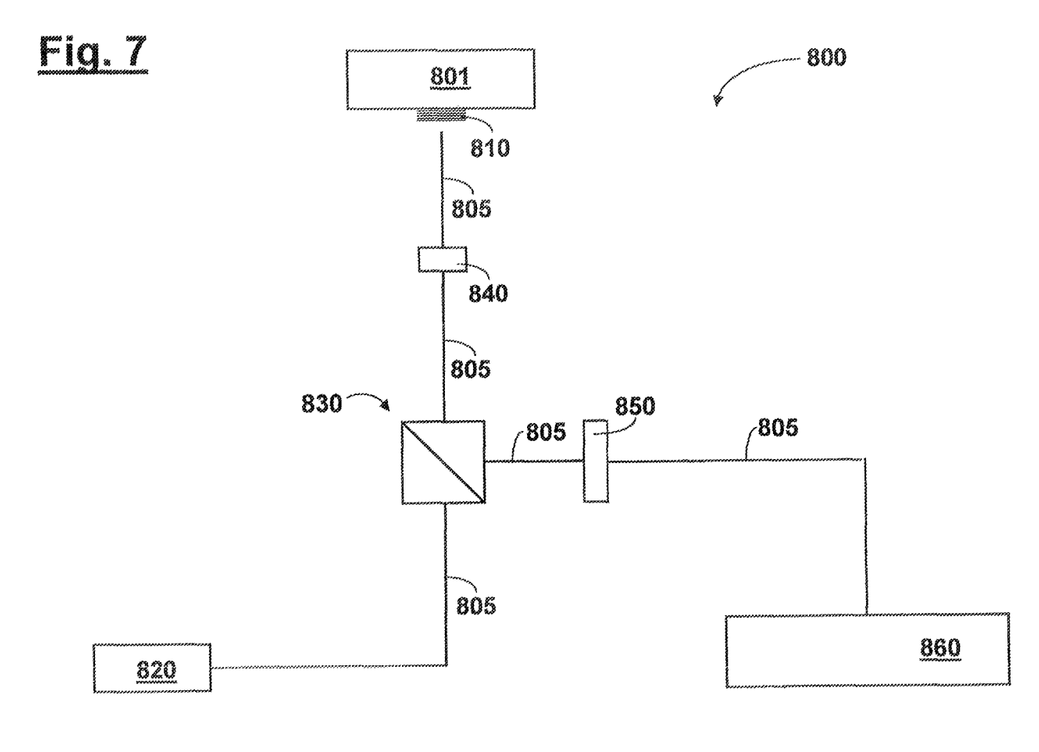

FIG. 7 shows a specific measuring arrangement by way of example, in which an optical element 810 mounted to the mirror 801 to be measured, in the form of a surface-emitting laser, is optically pumped, whereby electric feed lines to the surface-emitting laser are avoided and contact-less measurement is made possible. For that purpose, as shown in FIG. 7, a commercially available laser diode 820 with a glass fiber connection serves as the pump source, wherein a wavelength different from the wavelength of the surface-emitting laser is selected as the wavelength of the laser diode 820. In this case the pump light should lie in terms of energy above the laser emission and outside the stopband of the DBR.

The light of the laser diode 820 is passed via a glass fiber 805 and a beam splitter 830 as well as an UHV-compatible glass fiber transmission means 840 into the vacuum chamber of the projection objective of the projection exposure apparatus. There the light can be further passed by way of UHV-compatible glass fibers to the respective measurement points at one or more mirrors 801 of the projection objective. A suitable collimator optical system (not shown) at the end of the glass fibers focuses the light on to the surface-emitting laser 810 on the mirror 801 and again couples the light emitted by the surface-emitting laser 810 into the glass fiber 805. The collimator optical system can be of such a design configuration that the surface-emitting laser 810 or VCSEL chip is of a size of 0.5 * 0.5 mm². The emitted light is passed back on to the beam splitter 830 by way of the glass fiber 805 and from there coupled into a detector 860 by way of an edge filter 850 which fades out the pump wavelength.

Coupling the pump light into and out of the surface-emitting laser 810, which is adopted in the FIG. 7 structure, and also coupling the light emitted by the surface-emitting laser 810 into the same glass fiber 805, has the advantage that additional glass fibers are unnecessary. On the other hand, the unwanted introduction of stray light into the optical system is also prevented in comparison for example with optical pumping (which in principle is also possible) in a direction sideways or parallel to the mirror surface.

A thermal contact of the component which is respectively used (DBR or VCSEL) in relation to the mirror to be measured is necessary in each case in the embodiments described with reference to FIGS. 5-7, but in other respects 'interrogation' of the component in question (DBR or VCSEL) is effected in contact-less fashion. Similarly to the above-described embodiments it is also possible to use a plurality of the respective components employed (DBR or VCSEL), which in turn can be effected for example in a matrix-like arrangement.

Even if the invention has been described by reference to specific embodiments numerous variations and alternative embodiments will be apparent to the man skilled in the art, for example by combination and/or exchange of features of individual embodiments. Accordingly it will be appreciated by the man skilled in the art that such variations and alternative embodiments are also embraced by the present invention and the scope of the invention is limited only in the sense of the accompanying claims and equivalents thereof.

The invention claimed is:

1. A method, comprising:
   producing an output beam by interacting an input beam with a substrate of an EUV mirror in a microlithographic projection exposure apparatus without interacting the input beam with an EUV reflective surface of the EUV mirror, the substrate of the EUV mirror supporting the EUV reflective surface of the EUV mirror;
   determining an optical parameter of the output beam; and
   determining a heating condition of the EUV mirror based on the optical parameter.

2. The method of claim 1, wherein the substrate of the EUV mirror comprises a material having a refractive index, and the optical parameter depends on the refractive index of the material.

3. The method of claim 1, wherein the optical parameter comprises an optical path length change.

4. The method of claim 1, wherein the optical parameter comprises a polarization of the output beam.

5. The method of claim 1, wherein interacting the input beam with the substrate of the EUV mirror comprises interacting a plurality of input beams with the substrate the EUV mirror.

6. The method of claim 1, wherein interacting the input beam with the substrate of the EUV mirror comprises interacting a plurality of input beams with the substrate of the EUV mirror at different azimuth angles with respect to an optical axis of the optical system.

7. The method of claim 1, wherein producing the output beam comprises passing the input beam through the substrate of the EUV mirror at least once.

8. The method of claim 1, wherein producing the output beam comprises passing the input beam through the substrate of the EUV mirror a plurality of times.

9. The method of claim 1, wherein the output beam comprises infrared radiation.

10. The method of claim 1, wherein the optical parameter is interferometrically determined.

11. The method of claim 1, comprising operating the microlithographic projection exposure apparatus while interacting the input beam with the substrate of the EUV mirror and determining the optical parameter.

12. A method, comprising:
    producing an output beam by passing an input beam at least once through a region between a reflecting surface of an EUV mirror and a rear side of the EUV mirror without the input beam impinging on the reflecting surface of the EUV mirror, the EUV mirror being in a microlithographic projection exposure apparatus;
    determining an optical parameter of the output beam; and
    determining a heating condition of the EUV mirror based on the optical parameter.

13. The method of claim 12, wherein producing the output beam comprises passing the input beam through the EUV mirror a plurality of times.

14. The method of claim 12, wherein the region of the EUV mirror comprises a material having a refractive index, and the optical parameter depends on the refractive index of the material.

15. The method of claim 12, wherein the optical parameter comprises an optical path length change.

16. The method of claim 12, wherein the optical parameter comprises a polarization of the output beam.

17. The method of claim 12, wherein passing the input beam through the region of the EUV mirror comprises passing a plurality of input beams through the region of the EUV mirror.

18. The method of claim 12, wherein passing the input beam through the region of the EUV mirror comprises passing a plurality of input beams through the region of the EUV mirror at different azimuth angles with respect to an optical axis of the optical system.

19. The method of claim 12, wherein passing the input beam through the region of the EUV mirror at least once comprises passing the input beam through the region of the EUV mirror twice.

20. The method of claim 12, wherein passing the input beam through the region of the EUV mirror at least once comprises passing the input beam through the region of the EUV mirror a plurality of times.

21. The method of claim 12, wherein the optical parameter is interferometrically determined.

22. The method of claim 12, comprising operating the microlithographic projection exposure apparatus while interacting the input beam with the substrate of the EUV mirror and determining the optical parameter.

23. The method of claim 12, wherein the output beam comprises infrared radiation.

24. A method, comprising:
    producing an output beam by reflecting an input beam off an optical element supported by a mirror in a microlithographic projection exposure apparatus without the input beam impinging on an EUV reflective surface of the mirror;
    determining an optical parameter of the output beam; and
    determining a heating condition of the mirror based on the optical parameter.

25. The method of claim 24, wherein the optical element comprises a distributed Bragg reflector.

26. The method of claim 25, further comprising determining a reflectivity of the distributed Bragg reflector at a predetermined wavelength.

27. The method of claim 24, wherein the output beam comprises infrared radiation.

* * * * *

UNITED STATES PATENT AND TRADEMARK OFFICE
CERTIFICATE OF CORRECTION

PATENT NO. : 10,161,808 B2
APPLICATION NO. : 13/863595
DATED : December 25, 2018
INVENTOR(S) : Peter Vogt et al.

Page 1 of 1

It is certified that error appears in the above-identified patent and that said Letters Patent is hereby corrected as shown below:

In the Specification

Column 2, Line 64, delete "micro lithographic" and insert -- microlithographic --.

Column 4, Line 27-28, delete "micro lithographic" and insert -- microlithographic --.

Column 4, Line 43-44, delete "micro lithographic" and insert -- microlithographic --.

Column 4, Line 59-60, delete "micro lithographic" and insert -- microlithographic --.

Column 5, Line 67, delete "said" and insert -- the --.

Signed and Sealed this
Sixteenth Day of April, 2019

Andrei Iancu
*Director of the United States Patent and Trademark Office*